(12) United States Patent
Buks et al.

(10) Patent No.: US 6,496,013 B1
(45) Date of Patent: Dec. 17, 2002

(54) DEVICE FOR TESTING CIRCUIT BOARDS

(75) Inventors: Manfred Buks, Henstedt-Ulzburg (DE); Karim Hosseini, Hamburg (DE)

(73) Assignee: Scorpion Technologies AG, Hamburg (DE)

(*) Notice: Subject to any disclaimer, the term of this patent is extended or adjusted under 35 U.S.C. 154(b) by 0 days.

(21) Appl. No.: 09/509,250

(22) PCT Filed: Sep. 11, 1998

(86) PCT No.: PCT/EP98/05801
§ 371 (c)(1),
(2), (4) Date: Mar. 23, 2000

(87) PCT Pub. No.: WO99/15910
PCT Pub. Date: Apr. 1, 1999

(30) Foreign Application Priority Data

Sep. 24, 1997 (DE) .......................... 197 42 055

(51) Int. Cl.⁷ ................... H01H 31/04; G01R 27/26; G01R 31/26; G01R 31/02
(52) U.S. Cl. ............ 324/538; 324/667; 324/767; 324/752; 324/72.5
(58) Field of Search ................. 324/538, 750, 324/95, 501, 158.1, 537, 350, 96, 72, 667, 664, 72.5, 767, 752; 250/310

(56) References Cited

U.S. PATENT DOCUMENTS

| | | | | |
|---|---|---|---|---|
| 3,925,726 A | * | 12/1975 | Few | 324/72 |
| 4,186,338 A | * | 1/1980 | Fichtenbaum | 324/52 |
| 4,220,854 A | * | 9/1980 | Feuerbaum | 250/310 |
| 4,277,679 A | * | 7/1981 | Feuerbaum | 250/310 |
| 4,588,993 A | | 5/1986 | Babij et al. | 342/351 |
| 4,634,972 A | * | 1/1987 | Fazekas | 324/751 |
| 4,670,710 A | * | 6/1987 | Beha et al. | 324/72.5 |
| 4,743,837 A | * | 5/1988 | Herzog | 324/60 |
| 4,779,041 A | * | 10/1988 | Williamson, Jr. | 324/73 |
| 4,837,506 A | * | 6/1989 | Patterson | 324/752 |
| 4,843,329 A | * | 6/1989 | Beha et al. | 250/358.1 |
| 4,924,172 A | * | 5/1990 | Holmgren | 324/664 |
| 4,991,580 A | * | 2/1991 | Moore | 128/696 |
| 5,006,808 A | * | 4/1991 | Watts | 324/537 |
| 5,053,694 A | * | 10/1991 | Bohnert et al. | 324/96 |
| 5,124,660 A | * | 6/1992 | Cilingiroglu | 324/538 |
| 5,138,266 A | * | 8/1992 | Stearns | 324/537 |
| 5,210,500 A | * | 5/1993 | Pingel et al. | 324/667 |
| 5,218,294 A | * | 6/1993 | Soiferman | 324/158.1 |
| 5,254,953 A | | 10/1993 | Crook et al. | 324/538 |
| 5,406,209 A | | 4/1995 | Johnson et al. | 324/750 |
| 5,489,888 A | * | 2/1996 | Jagiella et al. | 340/537 |
| 5,795,631 A | * | 8/1998 | Parkansky et al. | 428/34.1 |
| 5,954,762 A | * | 9/1999 | Di Mino et al. | 607/149 |
| 5,954,763 A | * | 9/1999 | Di Mino et al. | 607/154 |
| 6,359,451 B1 | * | 2/2000 | Wallmark | 324/751 |
| 6,191,587 B1 | * | 2/2001 | Fox | 324/350 |

FOREIGN PATENT DOCUMENTS

| | | |
|---|---|---|
| DE | 26 39 831 | 9/1976 |
| EP | 527 321 A1 | 7/1992 |
| GB | 2 236 593 A | 4/1991 |

* cited by examiner

*Primary Examiner*—N. Le
*Assistant Examiner*—Wasseem H. Hamdan
(74) *Attorney, Agent, or Firm*—Rankin, Hill, Porter & Clark LLP

(57) ABSTRACT

An instrument to test electronic components, the instrument including a drive unit electrically connecting the component and electrically driving the component to generate a field in the nearby space. The instrument also includes a test device electrically insulated from the component and mounted in its vicinity in order to measure the field generated by the component. The drive unit is designed to apply a voltage to the component. The test device includes an instrument amplifier measuring the voltage differential of two electrodes positioned at two sites in the electric field generated by the component. One of the electrodes is positioned near the component.

14 Claims, 6 Drawing Sheets

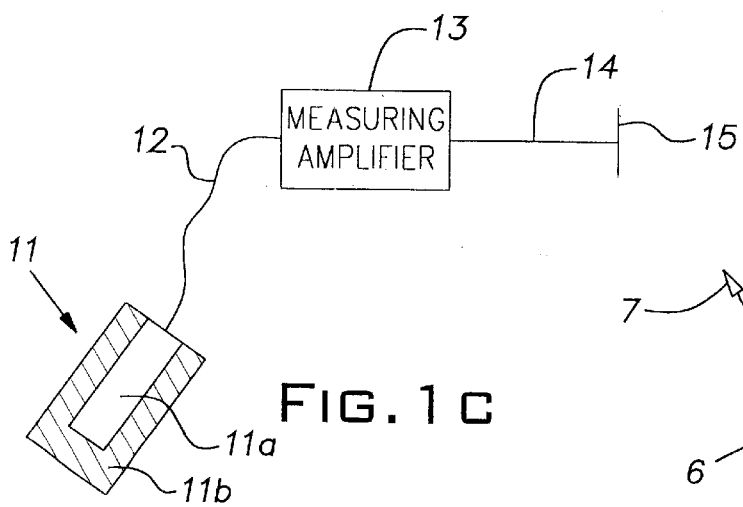
FIG. 1C
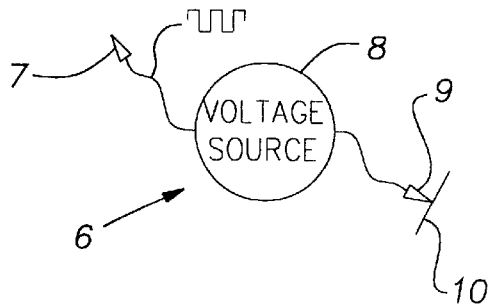
FIG. 1D
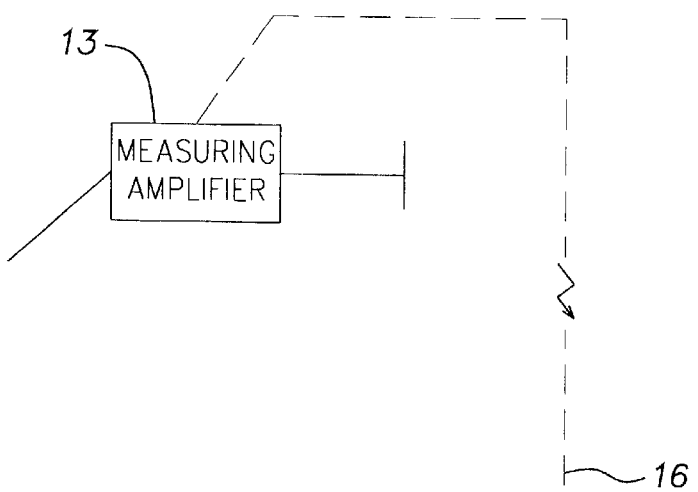
FIG. 1E
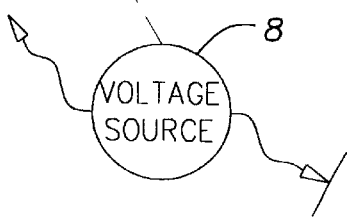

DEVICE FOR TESTING CIRCUIT BOARDS

BACKGROUND OF THE INVENTION

An instrument for testing circuit boards is known from U.S. Pat. No. 5,254,953, wherein a first electrode and a component being tested act as plates of a capacitor of which the capacitance is determined in the instrument by the change in capacitance. For that purpose the measuring amplifier must measure the current in a conductor between the first and second electrodes, latter in the known instrument of the species acting as the ground of the circuit on a circuit board subjected to testing.

This instrument allows component-testing for instance of circuit boards. Illustratively, if the component being tested does not make proper contact due to inadequate soldering or due to an electrical discontinuity, then only the substantially lower capacitance subtended with more remote components, for instance, the line on the other side of the discontinuity, shall be determined.

The instruments of this species offer the advantage of not requiring an electrical, hence mechanical contact between the first electrode and the component. Contact surfaces of high conductivity are not required at the component.

Illustratively, oxide layers do not interfere. Moreover, the measurement may be carried out passing through insulating layers or non-conducting housings.

Because the measurement gap is included in the measured capacitance, and provided the first electrode is accurately positioned, it is possible to ascertain geometric deviations of the component being tested, such as would be caused by bending, oblique assembly or the like. Furthermore, socket contacts can be measured that are designed only for single use and, therefore, may not be mechanically stressed, for instance by a tester plug.

The capacitive testing procedure of the known instrument incurs the drawback of requiring a current in the circuit for changing the change on the capacitor. In complex circuits, such a current also usually passes through other components of which any deviations will be included in the test result.

Because the measuring amplifier determines the current going to circuit ground, there always is additional capacitance between the first electrode and the circuit ground in parallel with the capacitance to be measured. Moreover, this spurious parallel capacitance is usually larger than that which is to be measured, and deviations in this parallel capacitance with ground entail substantial deviations. Also high test sensitivity is required in order to allow determining the small deviations of the measurement capacitance within the large total capacitance (measurement capacitance+much larger capacitance to ground).

A test instrument of this kind is known from the German patent document A1 26 39 831. In this known instrument, the field generated by the component when electrically loaded by a drive unit is measured with a field probe. In this known design, the field probe is a coil that responds solely to the field constituents of the component-generated electromagnetic field. However, magnetic fields are generated only if there is a current in the component. Accordingly, the drive unit must be designed so as to generate a current in the component. However, this feature entails drawbacks similar to those described above in relation to the capacitive method. All adjacent circuit components also passing a current might interfere. Components that somehow were improperly connected and, hence, do not pass a current cannot be tested at all. Furthermore, the inherent coil size limits the spatial resolution of this testing procedure.

SUMMARY OF THE INVENTION

An objective of the invention is to create a kindred instrument retaining the advantages of contact-less measurement and offering greater sensitivity in detecting deviations of the component being tested while being less sensitive to other circuit deviations.

In the instrument according to the present invention, the two electrodes are used to determine a voltage between two sites of the electrical field generated by the component under applied voltage. A magnetic field, and hence a current in the component, is not required. Accordingly, it is enough to make contact by one conductor alone with the component or a circuit fitted with a component. DC voltage may be used, and hence a purely electrostatic field is then generated. The two electrodes constitute a field probe allowing to survey with high accuracy the field geometry around the component. Both electrodes, preferably however one electrode near the component, may be displaced. Near the component to be tested, the field essentially depends only on that component. If the component illustratively is disconnected from the drive voltage because of inadequate soldering or a break in a conductor, there will be marked field deviations. These deviations can be easily ascertained relative to the nominal state that, for instance, was ascertained by a previous measurement on a properly operating circuit board. Geometric deviations of the component being tested, for instance skewness, bending etc. are very easily detected by the resultant field changes. Because of their geometrically remote positions, other components affect the field very little, especially as regards the near field around the component to be measured. The measurement procedure does not necessarily entail currents in the circuit and their ensuing spurious measurement errors. As in the kindred state of the art, any contact between the electrodes and the circuit is eliminated. Thus, surfaces offering good contacts are not needed. Measurement can be carried out across insulated surfaces or through plastic housings, for instance inside an IC imbedded in a plastic case. Because field asymmetries are detected especially well, the heretofore unsolved problem of spotting electrolytic capacitors mounted at the wrong polarity is now solved in a simple manner. The drive unit may apply special voltages to the component, for instance DC, which allows circumventing capacitor problems in the circuit. However, pulses, for instance AC voltages of arbitrary frequencies, also may be used. Even the electric field may be determined which is generated by the components at rated circuit operation. In this manner the instrument of the invention also may be used as a function tester. When the field probe of the invention offers appropriate geometric resolution, it will allow observing even the switching processes within an IC.

The second electrode may be mounted anywhere in the electric field, for instance far from the site of measurement. In this case the first electrode only need be moved from test site to test site. If both electrodes are near the component to be tested, then the electric near field, where the field intensity differentials are very high, shall be measured very accurately, free from the fields of other components.

The field probe can be mounted in very simple manner to the end of a shielded cable. As a result, field measurements can be carried out with a spatial resolution of less than 1 mm.

As a result of further features of the invention, when carrying out near-field measurements on components, it is possible to avoid electric contact with these components, even in the case of position deviations that would entail interfering electrical contact with the circuit.

The first electrode also may simultaneously sense several components. Provided there is appropriate excitation, i.e. drive, for instance in sequence, of the individual components, each time the other components being at ground, for instance by mans of the drive unit, a single position of the first electrode will allow measuring a. substantial number of components. This feature is especially advantageous when the components are substantially identical geometrically and electrically, for instance if they were the contact pins of a plug or the connection pins of an IC.

The drive unit may apply a DC voltage and generate an electrostatic field that can be accurately measured by the instrument of the invention. Advantageously, however, a pulsed voltage can be applied, or an AC voltage, which is more easily detected by the measuring amplifier.

Advantageously, low-frequency pulse trains are used which are outside the conventional frequency range being radiated by nearby test equipment and computers.

Preferably, the pulse shape is triangular. This feature offers the advantage that differentiation by the test instrument's capacitors will shape them into rectangles which are more easily processed by this instrument.

The measuring amplifier preferably suppresses DC voltages. Electrostatic fields, such as are generated by electrostatic charges accumulating in the vicinity of the test site and that may lead to spurious test results, are thereby suppressed. Advantageously, the test instrument is designed such that it suppresses any interference frequencies, such as line power (50–60 Hz range), and frequencies that are generated by nearby line-powered equipment, and other interfering frequencies near the measurement site, for instance by computer CPUs in the 100 MHz range, from robot control motors and the like.

In further accordance with the present invention, the electrical field near one or several components on a circuit board is mapped quantitatively by moving the electrode in its geometric configuration.

Alternatively, a large number of electrodes in a matrix array acting as the first electrodes are mounted, for instance parallel by their plane surfaces, to the circuit board to be tested. The matrix electrodes are connected, by means of an appropriate system, to the measuring amplifier and, in this manner, provide a static, immobile construction affording spatial resolution of the field generated by the component.

By means of column-and-row electrodes, of which every pair is crossing and connected to the measuring amplifier, allowing multiplex control, surface resolution of the field is possible. This is because, when connecting two electrodes of the matrix array, only these particular two are detecting at this time. The connected electrodes have their highest sensitivity at the location where they cross, whereby this crossing point indicates its local field intensity. By multiplex-controlling sequentially all column-and-row electrodes, the field intensities at all crossing points can be determined.

BRIEF DESCRIPTION OF THE DRAWINGS

The invention is shown in illustrative and schematic manner in the drawings of the invention.

FIG. 1c schematically illustrates an electrode according to the present invention;

FIG. 1d schematically illustrates application of a pulsed voltage;

FIG. 1e schematically illustrates wireless synchronization between the measuring amplifier he voltage source;

DETAILED DESCRIPTION OF THE PREFERRED EMBODIMENTS

Figure 1A:
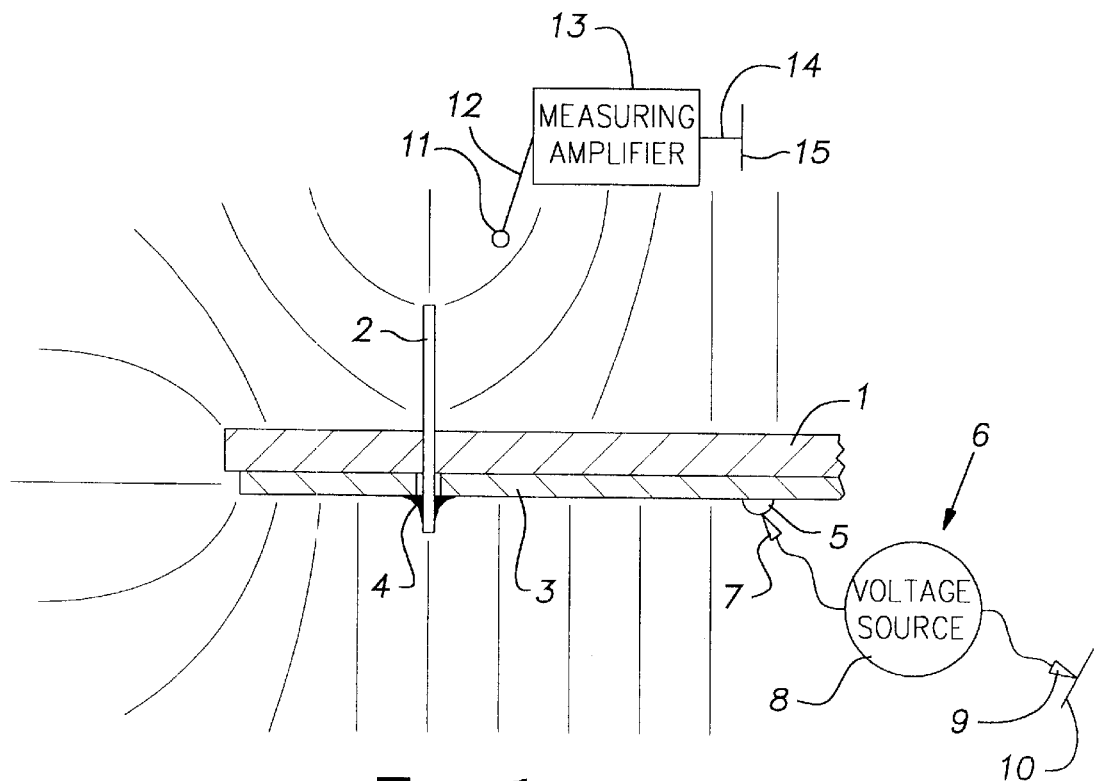
FIGS. 1a, 1b show testing for proper soldering of a pin to a conducting path.

FIG. 1a–FIG. 1e is a sectional view of a typical test situation of a non-conducting circuit board 1 to which is affixed a metal pin 2. The pin may be, for instance, one of several pins of a pin-connector strip. The pin 2 makes soldered contact 4 with a conducting path 3 on the circuit board.

A voltage, for instance DC of a few volts, is applied to the conducting path 3 at a suitable contact site 5 using a drive unit 6, the application being by means of a contact tip 7 connected to a voltage source 8. The second contact tip 9 of the voltage source 8 makes contact with a conductor 10, which is situated away from the conducting path 3. The conductor 10 may be the general ground, or the local circuit ground on the circuit board 1, or also a field plate suspended in free manner somewhere in the room.

An electric field is generated between the lead 10 and the conducting path 3 and the electrical components connected thereby, in particular the pin 2, and in the local environment.

If the lead 10 is remote from the components 2 and 3, the latter two will 'be immersed in an essentially unperturbed electric field of which the field lines run approximately as shown in FIG. 1a.

These field lines, as shown, are always perpendicular to the conductors 2, 3. At the conductor ends, that is, at their tips, the field lines are divergent. The field lines are substantially mutually parallel at elongated conductor segments.

Figure 1B:
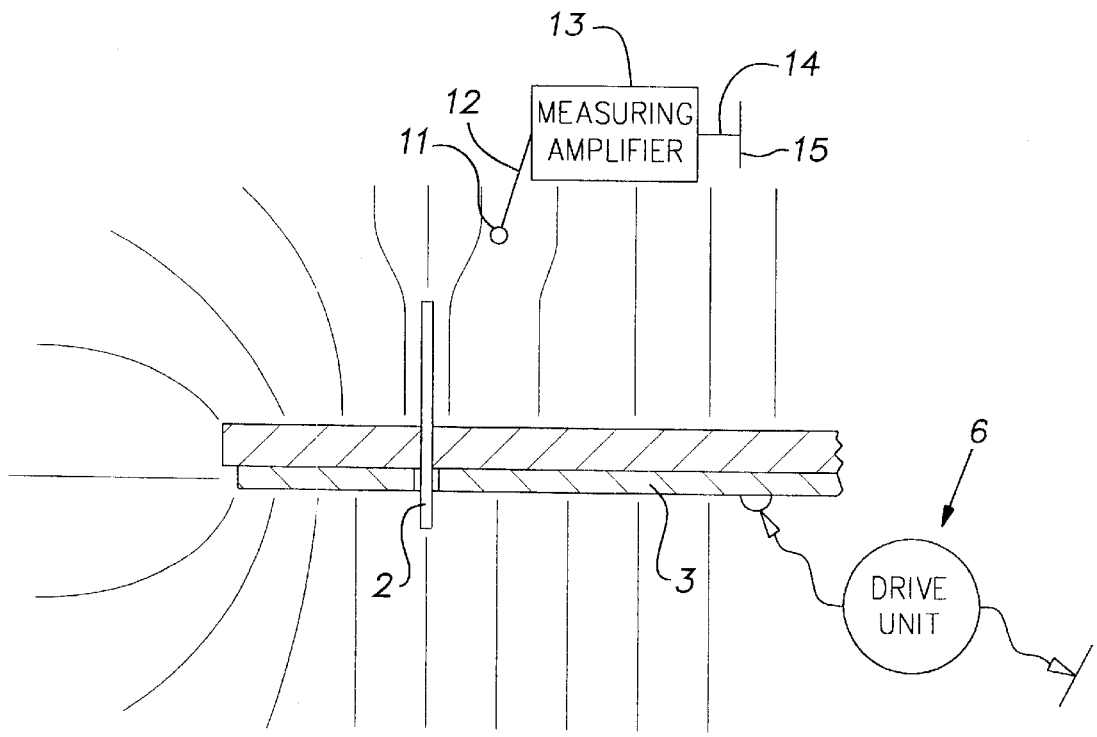

FIG. 1b shows the same configuration, though this time the solder 4 is missing. In this instance the pin 2 is electrically insulated from the conducting path 3. The voltage applied by the drive unit 6 to the conducting path 3 is not applied to the pin, 2. Accordingly the pin 2 is merely a conductor freely located in the electric field. It affects this field only slightly, that is charge displacements on it are minor. Consequently and as shown, the field lines run much differently than in FIG. 1a in the vicinity of the pin 2. In particular the strong divergence in the upper zone of the tip of pin 2 is missing.

Now a field probe fitted with an electrode 11, which assumes the same configuration relative to the pin 2 in both FIG. 1a and FIG. 1b, will detect wholly different field intensities in the cases of FIG. 1a and FIG. 1b. This fact is proof of the shown defect, namely the lacking solder 4. If other defects are present, for instance an electrically insulating break in the pin 2, for instance inside the circuit board 1, or if there a break in the conducting path 3, then similar distortions in the electric field take place and provide reliable evidence of the defect.

Since the measurement result is strongly affected by the geometry of the test site, it is possible to show a geometric deviation of the pin 2, for instance a bending of the pin, or insufficient length or the like. This, however, requires the field probe 11 to be accurately and repeatably positioned relative to the circuit board 1.

The shown field probe may comprise an electrode 11, illustratively in the form of a field plate connected by a lead 12 to an input of the measuring amplifier 13. The other input of the measuring amplifier 13 is connected by a second lead 14 to a second electrode in the form of a field plate 15, which is mounted anywhere else in the room. If the first and second electrodes 11 and 15 are far apart, then the electric field in the near field of the pin 2 is determined solely by means of the location of the first electrode 11. In this case, the second electrode 15 is preferably located in a region unaffected by the circuitry on the circuit board 1. However, the dipole constituted by the electrodes 11 and 15 also may be very compact, namely in the form of very small and very close electrodes 11 and 15, in which case said dipole will ascertain with great accuracy the local field intensity at the field probe 11. Such a dipole is a directional sensor, which is being more sensitive in the direction of the shown field lines than transversely to them. Hence, the field-line directions can be ascertained and the electric field can be detected very accurately.

Figure 2A:
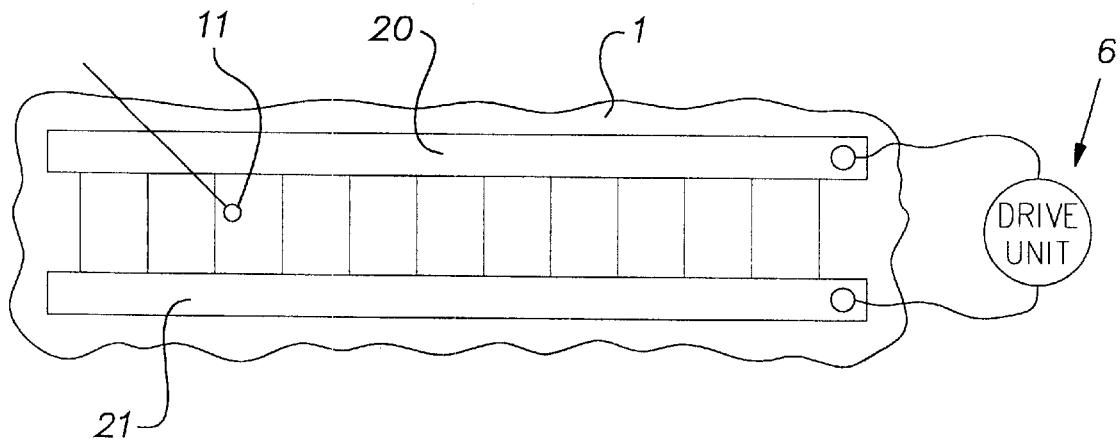
FIGS. 2a, 2b show testing two parallel conducting paths when there is a break in one of the conducting paths.
Figure 2B:
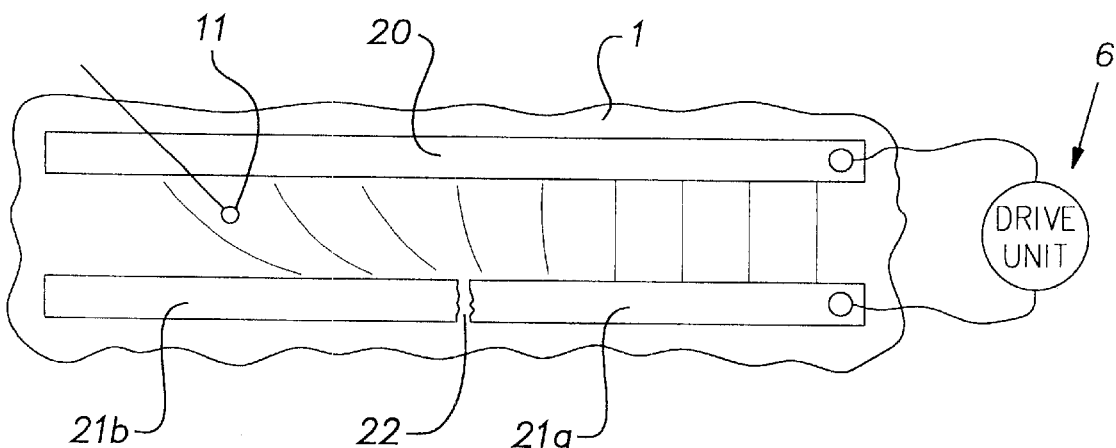

FIGS. 2a and 2b illustrate another typical measurement task regarding the circuit board 1 which this time is shown in top view. The drive unit 6 applies a potential difference to two parallel conducting paths 20 and 21. As shown in FIG. 2a, an electric field with parallel field lines is formed between the two conducting paths. This field can be determined at the site shown using the field probe's electrode 11, which may correspond to that of FIG. 1a–FIG. 1e.

In FIG. 2b the conducting path 21 is split by a break 22 into two sub-paths 21a and 21b. The drive unit 6 applies a voltage only to the sub-path 21a, the separated sub-path 21b being free of any applied voltage.

As indicated in FIG. 2b by the field lines therein, the electric field has been strongly altered. This substantial change in electric field is easily detected by the field probe 11 when compared with the measurement of FIG. 2a relating to a properly manufactured circuit board.

Figure 3A:
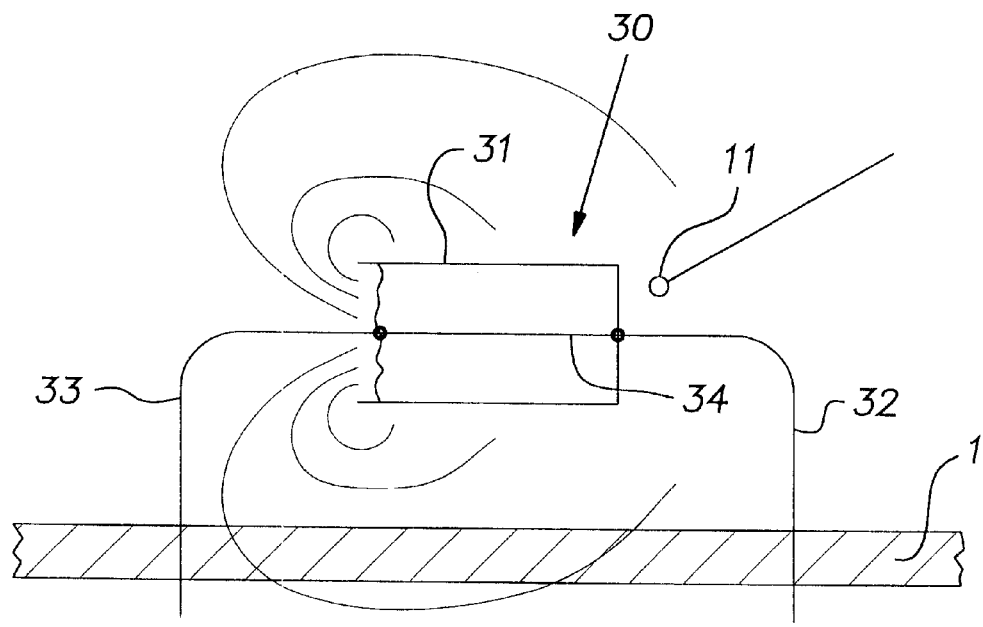
FIGS. 3a, 3b show a test of an electrolytic capacitor for proper mounting.
Figure 3B:
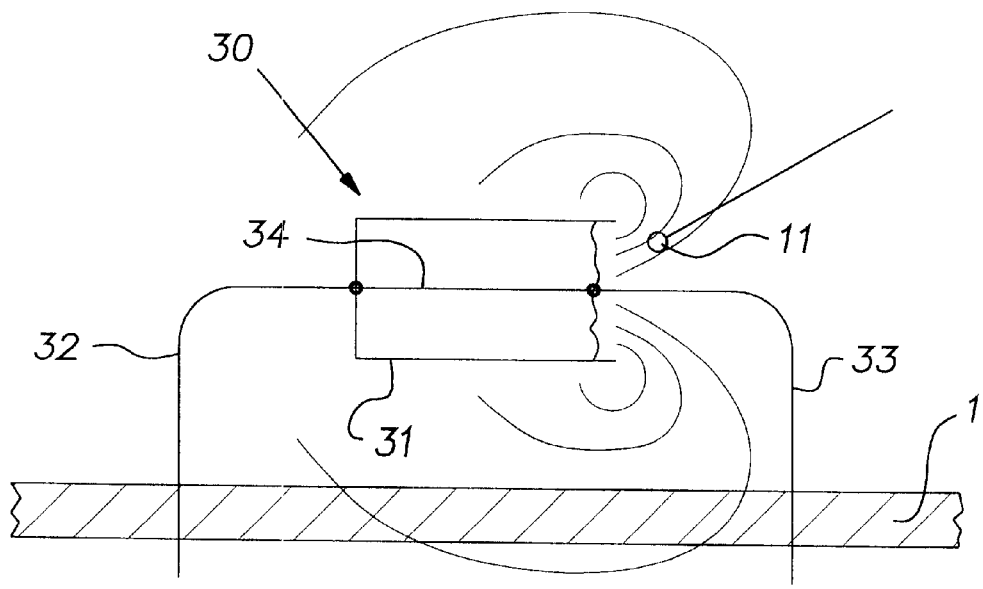

FIGS. 3a and 3b show in section an unusually taxing test case of the circuit board 1, namely relating to an electrolytic capacitor 30 shown for the sake of clarity in strongly diagrammatic and older form.

The electrolytic capacitor 30 comprises an outer electrode 31 in the form of a case constituting the housing and connected to a lead 32, further an inner electrode 34 connected to a lead 33.

FIG. 3a shows the electrolytic capacitor 30 in its proper orientation. In FIG. 3b the capacitor 30 has been reversed relative to its proper polarity. The reversed-polarity condition must be sensed by the test instrument.

A voltage is applied in both cases to the capacitor 30, by connecting the leads 32 and 33 to drive unit such as the drive unit 6 of FIG. 1a–FIG. 1e. As indicated in FIGS. 3a and 3b, in each instance there will be an electric field with field lines in the vicinity of the electrolytic capacitor 30. It is seen that in the zone of the electrolytic capacitor 30, wherein the lead 33 makes contact with the inner electrode 34, the field lines issue densely, that is with high field intensities, from the opening of the shielding case forming the outer electrode 31. Away from the opening of the shielding case, the field intensity is very low. If in both instances of FIGS. 3a and 3b the already-mentioned field probe 11 is configured identically and disposed close to the electrolytic capacitor 30, then there shall be very different test results for these two said instances. This clear test results are contrary to the outcome in all other known test instruments which, for the shown illustration of an electrolytic capacitor mounted at the wrong polarity, will display only minute test results.

Several tests with inverted driving polarities are not required by the present invention.

Figure 4:
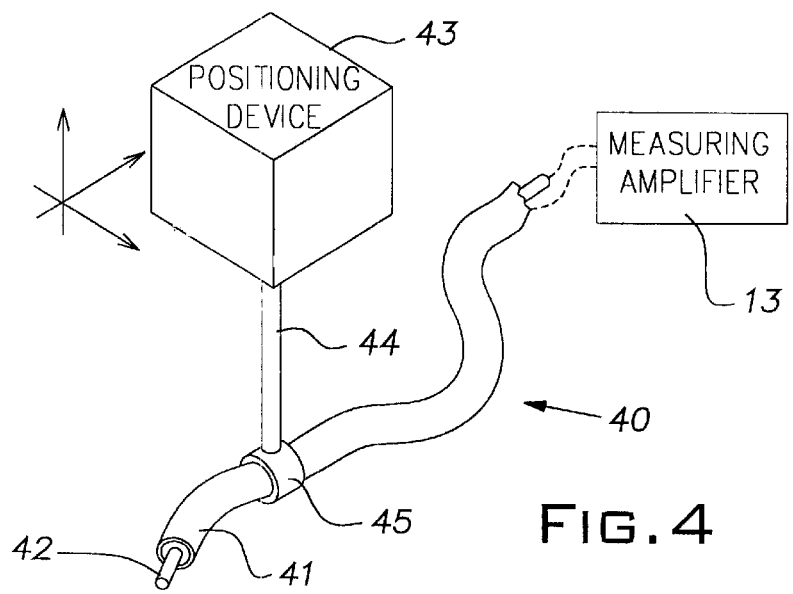
FIG. 4 shows a field probe of the invention mounted at the end of a shielded cable fitted with a positioning system.

FIG. 4 shows an illustrative field probe with a very compact dipole which, accordingly, is- highly resolving as regards the field geometry. The field probe is mounted at the end of a shielded cable 40. The two poles of this dipole are constituted by the outer shield 41 and by the inner conductor 42 projecting from the end of the shielded cable 40. If a very thin shielded cable of an outside diameter less than, for instance, 1 mm is used, the dipole field probe can be configured with a gap between the two poles of less than 1 mm and, accordingly, electric fields can be tested which require high spatial resolution.

Furthermore, FIG. 4 shows a positioning device 43, which can be displaced in the three shown coordinates by means (not shown). The positioning device supports the end zone of the shielded cable 40, that is the field probe, by means of an arm 44 and a clamp 45. Using the positioning device 43, the field probe can be accurately put in place in the electric field around the components.

The shielded cable 40 is connected at its end away from the field probe by its shield 41 and its inner conductor 42 to the two inputs of the above mentioned measuring amplifier 13, which contributes to determining the voltage across the electrodes 42 and 41, its input resistance necessarily being very high in order not to unduly affect the field.

Figure 5:
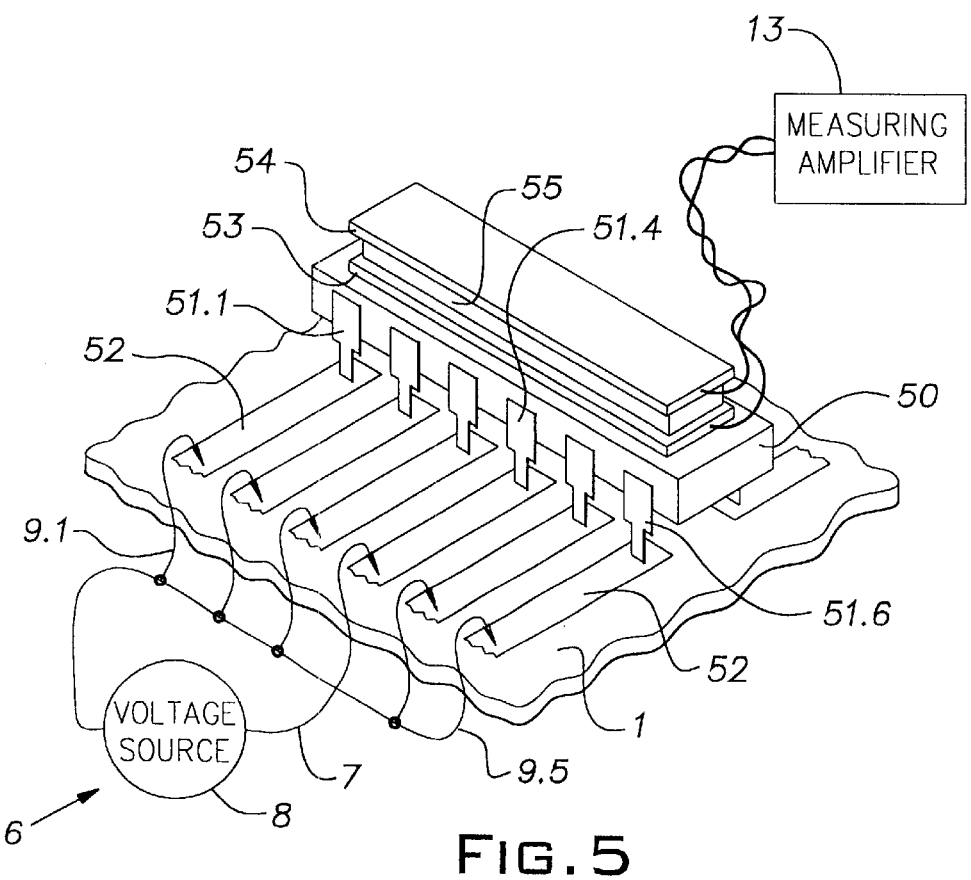
FIG. 5 shows a field probe of the invention to test all pins of an IC from only one position.

FIG. 5 is a perspective view of a commercial IC 50 with connector pins 51 in a row. A test is assumed to check that the pins 51.1–51.6 are properly soldered to conducting paths 52 of the circuit board 1, the solder sites possibly corresponding to those referenced by 4 in FIG. 1a.

It is assumed that the pin 51.4 is being checked for proper soldering. The above described drive unit 6 is used and, by a contact tip 7, is electrically connected to the conducting path leading to the pin 51.4 and, by means of the other lead, connects to a series of parallel contact tips 9.1–9.5 on all other conducting paths 52 leading to the other terminal of the voltage source 8. Accordingly, a voltage is applied across the pin 51.4 on one hand and to all the other pins on the other hand.

In the illustrative embodiment of FIG. 5, the test instrument comprises two electrodes 53 and 54 which are separated by an insulator 55 and which are connected by twisted leads to the above cited measuring amplifier 13. As shown by FIG. 5, the two electrodes 53 and 54 constitute large planes across the full IC 50 and, accordingly, are equally close to all pins 51.1 through 51.6. The electric field generated by the drive unit 6 applying a voltage to the pins can be detected by the electrodes 53 and 54 and be ascertained through the measuring amplifier 13. As shown by FIG. 5, substantially the same field is generated with different pin interconnections. Therefore, each pin 51.1–51.6 may be sequentially connected to the contact tip 7 of the drive unit 6, all remaining pins being connected to the contact tips 9.1–9.5, that is to the other output of the voltage source 8. In this manner, all pins 51.1–51.6 can be sequentially checked for proper soldering to their conducting paths 52 in the manner already described in relation to FIGS. 1a and 1b. The testing procedure is substantially simplified because the electrode configuration 53, 54 need not be repositioned at each step.

The testing configuration shown in FIG. 5 also is applicable to other, similar structures, for instance to the row-mounted pins of a pin-strip.

The measuring amplifier 13 described in the above embodiments must be designed to allow very weak field intensities. Accordingly it must be able to detect very low voltages, for instance in the $\mu v$ range.

As regards the design of the measuring amplifier 13, account must be taken that interfering extraneous fields may be present at the test site and may superpose on the field generated by the component being tested. Such extraneous fields, for instance, may be of low frequencies in the in the range of line frequencies, that is, they may be generated by close-by transformers. Moreover, nearby computers may strongly interfere in the 100 MHz range. Such interference can be suppressed in the test amplifier by suitable filters.

However, very substantial DC interference also may be present, for instance caused by electrostatic fields due to electrostatic charges. Therefore, the measuring amplifier 13 advantageously also suppresses DC interference.

If DC is suppressed in the measuring amplifier 13, the field generated by the component must be pulsed (FIG. 1d). Accordingly, the drive unit 6 is designed to generate pulses which may be DC pulses, AC pulses or which also may be used as sinusoidal AC. In such a case, such pulses advantageously shall be in the lower frequency range (i.e., below 100,000 Hz) because less interference arises in the lower frequency range. Preferably, the drive unit 6 is appropriately synchronized with the measuring amplifier 13 by the amplifier being auto-synchronized (i.e., wireless synchronization 16, FIG. 1e). In this manner interference from extraneous fields can be substantially suppressed.

In an especially preferred embodiment, the drive unit 6 generates triangular pulses which, following differentiating by capacitors, are converted into square pulses in the measurement system and, as such, are detected in especially simple manner by the measuring amplifier 13.

If, for instance, the field probe shown in FIG. 4, which is suitable for high-resolution tests of the electric field, is positioned in the near field of a component being checked out, for instance the pin 2 of FIG. 1a, and if it is desired to ascertain what the field is in the immediate vicinity of this component, then erroneous positioning may lead to electrical contact between the electrode 42 and the pin 2.

This would entail defective measurements. Accordingly, though not shown, this electrode or also both electrodes 42 and 41 may be coated with an insulator which shall not affect field measurement but, nevertheless, will prevent electrically conducting contact. This arrangement is shown in FIG. 1c as it relates to the electrode 11 having an inner metallic electrode 11a and an outer insulative cover material 11b.

It follows from the above discussion that the first electrode, which senses the field generated by the component(s), is able to determine such a field on a large scale as in FIG. 5 or spot-wise as shown in FIG. 4, using a positioning device which displaces the electrode through the field to map this field.

Figure 6:
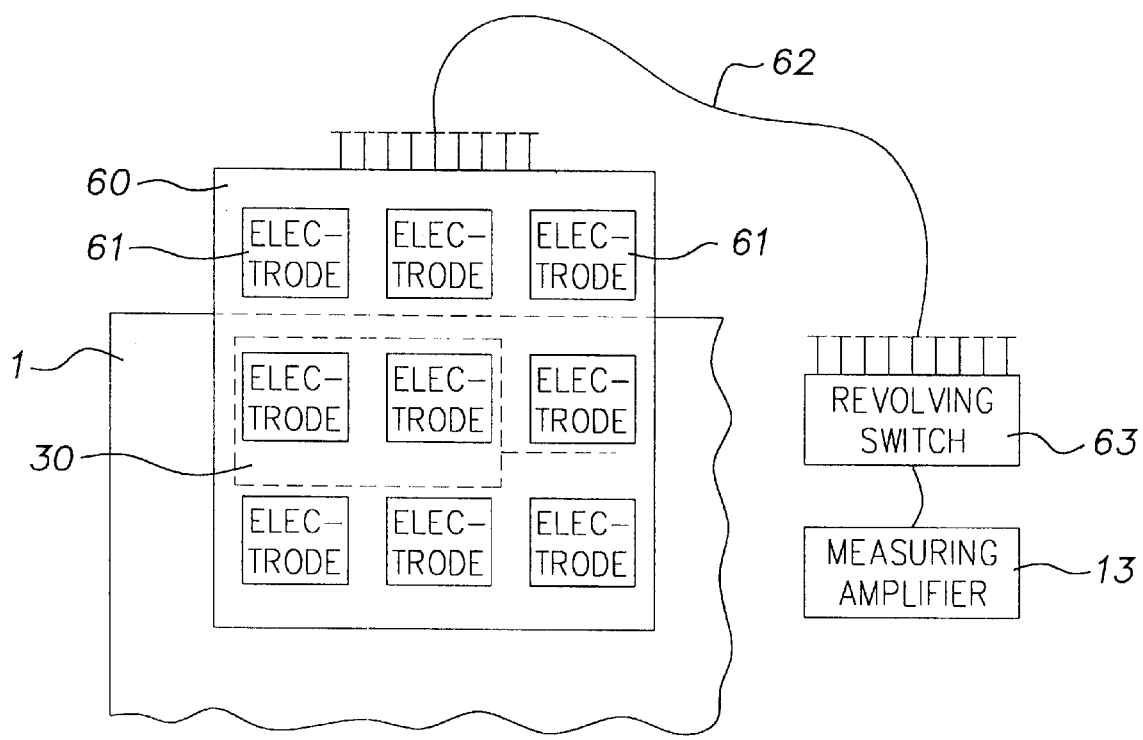
FIG. 6 is a top view of an embodiment of the field probe of the invention comprising an electrode matrix-array; and, FIG. 7 is a top view of a variation of the embodiment of FIG. 6 comprising a crossed-electrodes matrix.

In an alternative embodiment shown in FIG. 6, the field is measured spot-wise using a static, i.e., immovable, electrode configuration.

FIG. 6 shows the circuit board 1 fitted with a capacitor 30 of which the field must be determined in its vicinity. For that purpose, a non-conducting electrode base 60 is mounted parallel and adjacent to the circuit board 1 above the capacitor 30, with electrodes 61 arrayed in a rectangular matrix on the base 60. In this embodiment there are nine electrodes 61. These electrodes are connected by nine conductors 62 to a reversing switch 63 sequentially connecting the electrodes one at a time with the measuring amplifier 13.

The field in the vicinity of the capacitor 30 can be determined sequentially at the sites of the individual electrodes 61 in the manner of the first electrode 11 of FIG. 3a being displaced in the vicinity of the capacitor 30 in latter's field on the matrix points.

Figure 7:
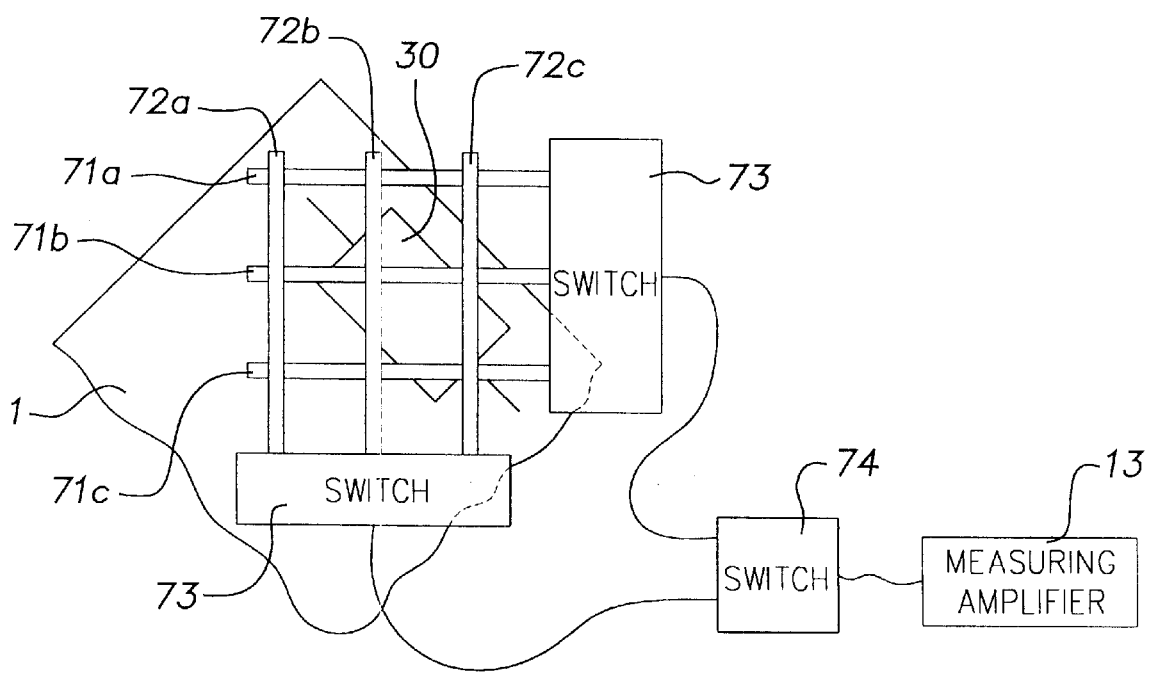

FIG. 7 shows a variation of the embodiment of FIG. 6 to map the field around the capacitor 30 on the circuit board 1.

In the embodiment of FIG. 7, the matrix of electrodes consists of three row-electrodes 71 and three column-electrodes 72 configured in crossing manners and connected by switches 73 and 74 to the measuring amplifier 13. If, for instance, the two electrodes 71a and 72a are connected by the switches 73, 74 to the measuring amplifier, then the field will be determined at the crossing site of these two electrodes. If, for instance, the electrodes 71c, 72c are connected, then the field shall be determined at their crossing site. In this manner the two measurements shown in FIGS. 3a and 3b can be carried out. When using a much larger number of row and column electrodes, then the field can be determined over a very large circuit area at a resolution depending on the electrode separation.

Components of all kinds, such as individual switches, capacitors, ICs and the like can be tested with the shown instruments. Furthermore, circuit boards lacking components can also be tested, especially as regards conduction breaks. Moreover, electric circuits with several components, such as component-bearing circuit-boards, can also be tested.

What is claimed is:

1. An instrument to test electronic components (1, 2, 21, 30, 51.4) fitted with a drive unit (6) making electric contact with the component and, upon application of a voltage to the component, causing the component to generate an electric field in nearby space, said instrument including a measurement system, said measurement system being electrically unconnected to said components and said drive unit, said measurement system including first and second electrodes mounted in a vicinity of the component to measure the electric field generated by said component, wherein the drive unit (6) applies a voltage to the component (1, 2, 21, 30, 51.4) and wherein the measurement system comprises a measuring amplifier (13) measuring an electric voltage differential of said first and second electrodes (11, 14), said first electrode being disposed at a first location in the component-generated electric field while the second electrode is disposed at a second location in the component-generated electric field, and wherein said first electrode (11; 42; 53; 1; 71, 72) is spaced a first distance from said component and said second electrode is spaced a second distance from said component, said first distance being smaller than said second distance;

wherein the first and second electrodes are disposed a third distance from one another, said third distance being on the order of the size of the component being tested.

2. The instrument as claimed in claim 1, wherein said third distance is generally equal to the size of the component being tested.

3. The instrument as claimed in claim 2, wherein said second electrode is constituted by a shield (41) of a shielded cable (40) and the first electrode is constituted by an inner conductor (42) of said cable, said inner conductor projecting from said shield (41).

4. The instrument as claimed in claim 1, wherein the first electrode (11, 42, 53) is fitted with insulation preventing electrical contact.

5. The instrument as claimed in claim 1, wherein the first electrode (53) is large and covers several components (51.1–51.6).

6. The instrument as claimed in claim 1, wherein the driving unit (6) applies a pulsed voltage.

7. The instrument as claimed in claim 6, wherein the pulsed voltage has a frequency less than 100,000 Hz.

8. The instrument as claimed in claim 6, wherein individual pulses of the pulsed voltage are triangular in shape.

9. The instrument as claimed in claim 6, wherein the measuring amplifier (13) suppresses DC.

10. The instrument as claimed in claim 6, wherein the measuring amplifier (13) suppresses interfering frequencies.

11. The instrument as claimed in claim 6, wherein the measuring amplifier (13) operates in a synchronized manner with the drive unit (6).

12. The instrument as claimed in claim 1, wherein the first electrode (11, 42) is displaceably mounted in the vicinity of the component (2, 21, 30).

13. The instrument as claimed in claim 1, wherein the first electrode assumes the form of a matrix of separate matrix-electrodes (61) selectively connected to the measuring amplifier (13).

14. The instrument as claimed in claim 13, wherein the matrix-electrodes comprise crossing column-electrodes (72a–72c) and row-electrodes (71a–71c) of which one of the column-electrodes and one of the row electrodes are simultaneously connected.

* * * * *